(12) United States Patent
Hagen et al.

(10) Patent No.: US 7,190,059 B2
(45) Date of Patent: Mar. 13, 2007

(54) ELECTRONIC COMPONENT WITH A STACK OF SEMICONDUCTOR CHIPS AND A METHOD FOR PRODUCING THE ELECTRONIC COMPONENT

(75) Inventors: Robert-Christian Hagen, Sarching (DE); Holger Woerner, Regensburg (DE)

(73) Assignee: Infineon Technologies AG, Munich (DE)

( * ) Notice: Subject to any disclaimer, the term of this patent is extended or adjusted under 35 U.S.C. 154(b) by 79 days.

(21) Appl. No.: 10/669,539

(22) Filed: Sep. 24, 2003

(65) Prior Publication Data

US 2004/0063304 A1   Apr. 1, 2004

(30) Foreign Application Priority Data

Sep. 24, 2002   (DE)   ................................ 102 44 664

(51) Int. Cl.
*H01L 21/44*   (2006.01)
(52) U.S. Cl. ....................... 257/686; 257/777
(58) Field of Classification Search ................ 257/686, 257/776–777, 734–738; 438/123, 108
See application file for complete search history.

(56) References Cited

U.S. PATENT DOCUMENTS

| | | | |
|---|---|---|---|
| 5,384,689 A | 1/1995 | Shen | |
| 6,353,263 B1* | 3/2002 | Dotta et al. | 257/777 |
| 6,392,304 B1* | 5/2002 | Butler | 257/777 |
| 6,420,789 B1 | 7/2002 | Tay et al. | |
| 6,424,050 B1 | 7/2002 | Komiyama | |
| 6,621,172 B2* | 9/2003 | Nakayama et al. | 257/787 |
| 6,717,252 B2* | 4/2004 | Saeki | 257/686 |
| 2002/0031864 A1 | 3/2002 | Ball | |
| 2002/0031867 A1 | 3/2002 | Horiuchi et al. | |
| 2002/0105067 A1* | 8/2002 | Oka et al. | 257/686 |
| 2002/0130404 A1* | 9/2002 | Ushijima et al. | 257/686 |
| 2003/0127720 A1* | 7/2003 | Fang | 257/686 |
| 2003/0197284 A1* | 10/2003 | Khiang et al. | 257/777 |

FOREIGN PATENT DOCUMENTS

| | | |
|---|---|---|
| DE | 100 43 450 A1 | 3/2002 |
| EP | 1 045 443 | 10/2000 |
| EP | 1 317 001 A1 | 6/2003 |

* cited by examiner

*Primary Examiner*—Nathan W. Ha
(74) *Attorney, Agent, or Firm*—Laurence A. Greenberg; Werner H. Stemer; Ralph E. Locher

(57) ABSTRACT

The invention relates to a method for producing an electronic component, a stack of semiconductor chips, and an electronic component including a stack of semiconductor chips. The stack has at least a lower electronic module connected via flipchip connections to a central area of a rewiring substrate. The stack also has at least an upper electronic module with external contact surfaces connected via bonding connections to outer areas of the rewiring substrate.

19 Claims, 4 Drawing Sheets

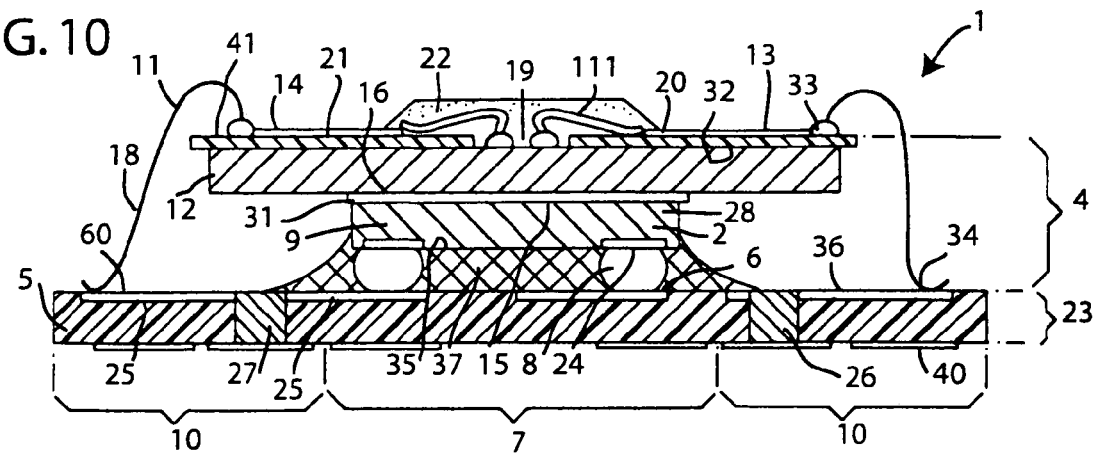
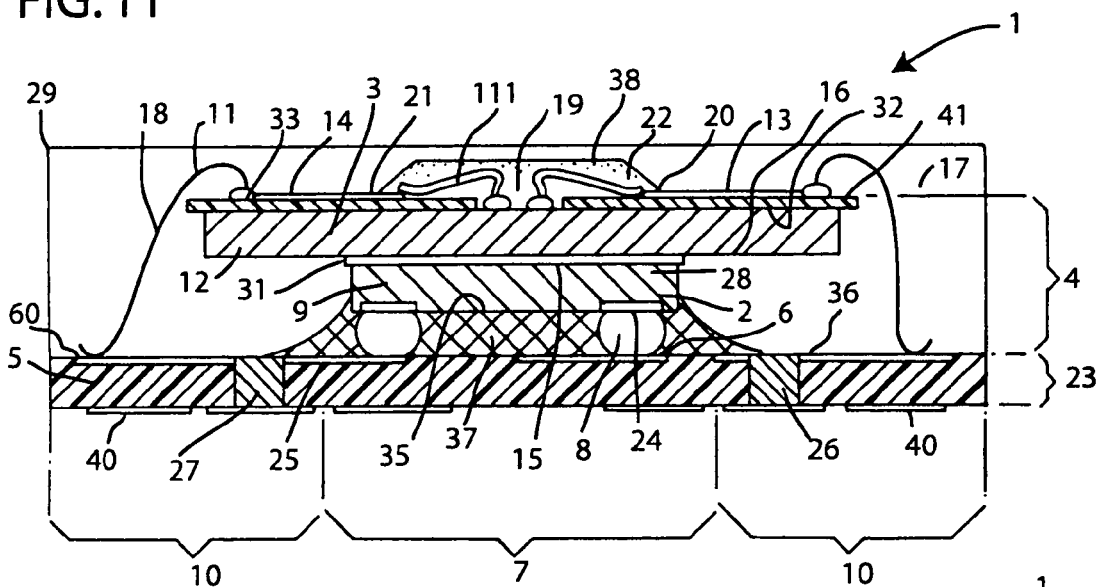
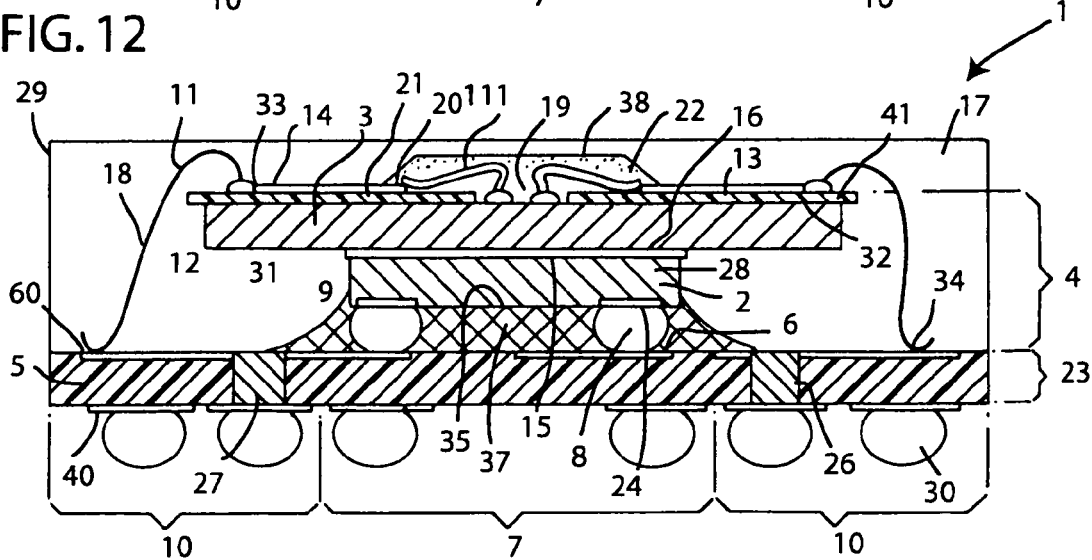

ELECTRONIC COMPONENT WITH A STACK OF SEMICONDUCTOR CHIPS AND A METHOD FOR PRODUCING THE ELECTRONIC COMPONENT

BACKGROUND OF THE INVENTION

Field of the Invention

The invention relates to an electronic component with a stack of semiconductor chips, and a method for producing the component. In particular, the invention relates to an electronic component with a stack formed from a logic chip based on flipchip technology and a memory module whose operation has been tested and which uses bonding technology.

The goal of achieving increasingly greater circuit densities is leading to greater system integration, and increasing attempts are being made to arrange two or more semiconductor chips in a stack. In this case, a complete component frequently has to be rejected merely because the memory chip is not operating, even though the logic chip is intrinsically functional.

SUMMARY OF THE INVENTION

It is accordingly an object of the invention to provide an electronic component with a stack of semiconductor chips, and a method for producing the electronic component, which overcomes the above-mentioned disadvantages of the prior art apparatus and methods of this general type.

In particular, it is an object of the invention to provide a method for producing electronic components with semiconductor chips configured in a stack at a low cost.

In particular, it is also an object of the invention to ensure that the electronic components have reduced failure rates in the functional tests.

With the foregoing and other objects in view there is provided, in accordance with the invention, a method is provided for producing an electronic component with semiconductor chips in a stack. First of all, a rewiring substrate is produced for this purpose, having connecting pads for flipchip connections in a central area. Furthermore, the rewiring substrate has edge areas with connecting pads for bonding connections. The rewiring substrate is thus able to electrically connect both a stack of semiconductor chips using flipchip technology and a stack of semiconductor chips using bonding technology to external contacts of the electronic component. Next, a first electronic module in the form of a semiconductor chip using flipchip technology is fitted to this rewiring substrate, which has connecting pads for flipchip connections in its central area.

In parallel with this, at least one second electronic module is produced which, in addition to its semiconductor chip, has a rewiring structure with external contact surfaces. This second electronic module is fitted as an upper module to the first electronic module, such that the passive rear faces of the first and the second electronic modules rest one on top of the other. Bonding connections are then produced between the external contact surfaces of the second upper electronic module and the connecting pads in the edge areas of the rewiring substrate. Finally, the stacked electronic modules are then packaged to form an electronic component with a plastic packaging compound fitted to the rewiring substrate.

This method has the advantage that applying the rewiring structure to the active upper face of the semiconductor chip of the upper electronic module creates an intermediate substrate, which provides the upper electronic module with the necessary robustness for handling in a test procedure. In addition, external contacts can be fitted at least temporally to the external contact surfaces of the rewiring structure, in order to test the operation of the upper electronic module independently of the stack in extreme temperature cycles. These external contacts, which may be required for test connectors that are specified, can be removed before the upper electronic module is installed in the stack, in order to provide the external contact surfaces for bonding during assembly of the electronic component.

The increased robustness of the upper electronic module allows the bonding connections between the external contacts at the edge of the rewiring structure of the upper electronic module and the connecting pads for bonding connections in the edge areas of the rewiring substrate to be produced without any problems and with increased reliability, once the passive rear faces of the electronic module have been brought together. This is because the brittle material of the semiconductor chip for the upper module is relieved of loads during the bonding process by the intermediate mount for the rewiring structure, so that the risk of forming microscopic cracks in the semiconductor chip during the bonding process is reduced. In order to provide a bonding connection, the normals to the surface of the connecting pads for bonding connections and the normals to the surface of the external contact surfaces of the upper electronic module point in the same direction.

A further possible advantage of the method is that for the upper electronic modules being bonded, it is also possible to use components with a larger passive rear face than that of the semiconductor chips arranged underneath them, because the robustness of the upper electronic modules is increased by the rewiring structure with an intermediate substrate in the area of the external contact surfaces to be bonded, and the bonding process does not take place on the semiconductor chip, but on the intermediate substrate. This is particularly advantageous when a logic chip is used as the first lower electronic module, and a memory chip with a larger area is used as the second upper electronic module.

Before the upper electronic module is fitted to the passive rear face of the semiconductor chip of the lower electronic module, the upper electronic module can thus be subjected to temperatures of $-50°$ C. to $150°$ C., during which its functionality is tested. In the process, the module is operated electrically. To do this, the rewiring structure, with its external contact surfaces, can be matched to the grid size of appropriate test connectors. The temporary application of external contacts to the external contact surfaces of the rewiring structure as mentioned above can also provide improved contact with the test connectors. After removal of the temporary fitted external contacts, the external contact surfaces are available for bonding connections during the assembly of the electronic component.

According to the invention, all of the signal connections on the upper electronic module can be accessed during a functional test. This accordingly allows a more valid test result, not least because access to all of the signal connections of the upper electronic module independently of the other electronic modules in the stack is no longer possible after assembly of the electronic component. If a functional test such as this for the upper electronic module is carried out before the assembly of the electronic component, then the overall yield is improved, and this results in considerable cost advantages. This is because at least one or both of the electronic modules is or are tested in advance, thus making it possible to ensure that even electronic modules with a potentially high failure probability, such as memory chips, are used only after they have been tested in detail as described above. Stacking the electronic modules one above the other also saves space, increases the circuit density, and optimizes costs. Furthermore, the electrical characteristics are improved, since this results in short bonding connections, and this is associated with the reduction in parasitic inductances.

The passive rear faces of the electronic modules can advantageously be adhesively bonded to one another. Conductive adhesives can be used for this purpose, for example, when the rear faces of the electronic modules are at the same potential. If there are intended to be potential differences between the rear faces of the electronic modules, then insulating adhesives can be used.

The bonding connections between the external contacts on the upper electronic module and the connecting pads in the edge area of the rewiring substrate can be produced by thermocompression bonding. In the process, a bonding head is formed on one of the surfaces to be connected, and the bonding wire is initially connected from this bonding head in the direction of the normal to the surface before it can be bent toward the second surface, where it is electrically bonded to the second surface, forming a bonding clip. While the bonding clip can be fitted to the second surface virtually tangentially with respect to that surface, the bonding head with the curved bonding wire must be at a minimum height above the bonded surface. It is therefore advantageous for the bonding head first of all to be produced on the connecting pad for the bonding connections in the edge area of the rewiring substrate—with the bonding clip not being formed on the external contact surface of the rewiring structure of the upper electronic module until this has been done. This also minimizes the component height of the electronic component with semiconductor chips in a stack.

A central bonding channel can be incorporated in the rewiring structure of the upper electronic module. The central bonding connections of this central bonding channel are electrically conductively connected to the external contact surfaces via bonding fingers and via rewiring substrate lines. The external contact surfaces may be distributed over edge areas of the upper electronic module, thus simplifying the process of bonding to the connecting pads in the edge areas of the wiring substrate, and allowing short bonding wire lengths.

The central bonding connections in the bonding channel have smaller dimensions than the bonding connections on the external contact surfaces, so that they are sufficiently protected by the bonding channel enabling the upper electronic module with an open unprotected bonding channel to be subjected to a functional test by careful handling. However, the bonding channel may advantageously be covered by a plastic protective sheath embedding the central bonding connections in the bonding channel, before the upper electronic module is subjected to a functional test. This has the advantage that it simplifies the handling both during the functional test and during the subsequent assembly process, and reliably prevents damage to the central bonding connections.

A printed circuit board that is metallized on both sides may be used as the rewiring substrate. The metal plating on the upper face and the metal plating on the lower face of the printed circuit board are structured. The structure on the upper face may have contact connecting pads for flipchip connections in a central area. Connecting pads for bonding connections may be provided in the edge areas of the upper face. The structured metal plating on the lower face of the printed circuit board may have external contact surfaces, which can be electrically connected to the connecting pads via through-contacts and via rewiring substrate lines. A rewiring substrate such as this based on a printed circuit board which is metallized and structured on both sides can be produced at low cost, and has a considerable price advantage over rewiring substrates based on ceramic.

Once the electronic modules to be formed into a stack have been fitted to a rewiring substrate that has been prepared in this way, the electronic modules can be embedded in a filled epoxy resin by a transfer molding process. This packaging process can be carried out simultaneously for two or more electronic components, provided that the rewiring substrate that is used has an appropriate number of component positions in which electronic modules are stacked and bonded. While the bonding connections are severely loaded during the transfer molding process, because of the high pressure and the flowing characteristics of the filled epoxy resin, packaging the electronic modules in a plastic package using a dispensing process provides considerably better protection.

Finally, external contacts can be fitted to the external contact surfaces of the rewiring substrate. These external contacts may have solder balls. A solder resist varnish layer surrounding the external contact surfaces prevents the material of the external contacts from wetting rewiring substrate lines, for example.

The invention also relates to an electronic component with a stack of semiconductor chips and a rewiring substrate. Connecting pads for flipchip connections are provided in a central area of the rewiring substrate. The rewiring substrate has connecting pads for bonding connections in its edge areas. Contact areas on a first lower electronic module, which is in the form of a semiconductor chip, are connected to the connecting pads in the central area of the rewiring substrate. A second upper electronic module has a semiconductor chip with a rewiring structure, and with external contact surfaces. The upper electronic modules are arranged on the lower electronic modules such that the passive rear faces of the electronic modules rest one on top of the other. In order to electrically connect the upper electronic module to the rewiring substrate, bonding connections are provided between the external surfaces of the upper electronic module and the connecting pads in the edge areas of the rewiring substrate.

The stack formed from at least one semiconductor chip using flipchip technology and from an electronic module with a rewiring structure and with external contact surfaces is surrounded by a component package. An electronic component formed from a combination of the semiconductor chip as the first lower electronic module and from a second upper electronic module, which is mostly packaged, has the advantage that the external contact surfaces on the upper electronic module can be used in order to test the functionality of the largely packaged upper electronic module in extreme temperature conditions before being assembled to form an electronic component, so that a reliable statement can be made as to whether the stack has at least one fully functional upper electronic module. The stacking process reduces the amount of space required, and increases the circuit density. The capability to carry out functional tests on the upper electronic module separately allows cost optimization and a capability to reliably predict the final electrical characteristics of the electronic component.

These advantages are particularly important when the lower electronic module is a logic chip and the upper electronic module is a memory chip with a rewiring structure and with external contact surfaces. Memory chips such as these have a relatively high failure rate during functional testing in extreme temperatures between −50° C. and 150° C. This failure rate can be reduced for the electronic component with a stack including a logic chip and a memory chip, if the memory chip is provided in advance with a rewiring structure with external contact surfaces, thus allowing independent complete functional testing before the rest of the stack is formed.

A further advantage is that the external contact surfaces on the upper electronic module can be placed in the edge areas of the upper electronic module, because of the wiring structure, thus allowing extremely short bonding connections from the external contact surfaces to the connecting pads in the edge areas of the rewiring substrate. The short bonding connections result in adequate bonding wire robustness, so that a highly filled epoxy resin can be used as the material for the plastic package, without having to take any particular precautions for protecting the bonding connections.

The rewiring structure with its intermediate substrate and the external contact surfaces on the upper electronic module at the same time improve the mechanical robustness of this electronic module, thus improving the overall reliability of the electronic component, and in the process reducing the risk of microscopic cracks being formed in the semiconductor chip during the bonding process, since the bonding process is not carried out directly on the semiconductor chip.

The rewiring substrate has a printed circuit board which is metallized and structured on both sides. This printed circuit board has through-contacts as an electrical connection between the structured metal layers on the upper face and on the lower face of the printed circuit board. The lower face of the printed circuit board has external contact surfaces for external contacts. In its central area, the upper face of the printed circuit board has the connecting pads for the flipchip connections and, in its edge areas, it has the connecting pads for bonding connections. The external contact surfaces on the lower face of the printed circuit board are electrically connected via through-contacts and via rewiring substrate lines to the connecting pads on the upper face. A rewiring substrate such as this based on a printed circuit board can be produced at low cost in comparison to rewiring substrate films or rewiring substrates based on ceramics.

An adhesive layer is arranged between the passive rear faces of the electronic modules, which rest one on top of the other. If the adhesive layer is formed by a conductive adhesive, the rear faces of the electronic modules may be at the same potential. An adhesive layer composed of an insulating adhesive may then, for example, be provided between the two rear faces of the electronic modules, if a potential difference is desired on the rear faces between the two electronic modules.

The upper electronic module has a central bonding channel with central bonding connections on its active upper face. These central bonding connections are connected to the external contact surfaces via the rewiring structure that is arranged on the active upper face. This bonding channel may have a protective sheath for its central bonding connections, thus forming a material boundary between a protective sheath such as this and the plastic package for the electronic component. A bonding channel such as this with central bonding connections is used in particular for memory chips, in order to use the relatively large upper active face of the memory chips on both sides of the bonding channel for the arrangement of external contact surfaces.

The bonding connections between the external contact surfaces and the connecting pads in the outer areas of the rewiring substrate may use a bonding wire which is subdivided into a bonding head and a bonding clip. The bonding head may be arranged on one of the connecting pads of the rewiring substrate, while the bonding clip is arranged on the corresponding external contact surface of the upper electronic module. This configuration of the bonding connections has the advantage that the bonding clip occupies a smaller height than the bonding head, so that the overall height of the electronic component can be minimized.

The invention also provides for an intermediate space to be formed for the contact areas between the active upper face of the semiconductor chip in the lower electronic module and the upper face of the rewiring substrate. This intermediate space is filled with an underfilling material, which includes a highly filled plastic with a filling level of 80 to 95% by weight. This high filling level of the underfilling material allows the thermal expansion behavior of the underfilling material to be largely matched to the thermal expansion behavior of the semiconductor chip.

In summary, it can be stated that a memory chip in a BOC package (board on chip package), for example, can be used as a second upper module in an electronic component, before its chip rear face, which remains free, is adhesively bonded to a logic chip using flipchip technology. This memory chip can be burned into its package at this stage, and can be subjected to and tested in extreme temperatures. Optimization of the bonding process during the connection of the upper memory chip to the rewiring substrate also allows a memory chip to be stacked in a space-saving manner on a logic chip.

The rewiring structure that is fitted to the memory chip together with its intermediate substrate result in a highly flexible packaging concept in terms of design and routing, as well as rewiring substrate routing. This package for the upper memory chip makes matching easier when using memory modules from different suppliers or when technology changes occur, since the rewiring substrate allows matching to take place without having to make any changes to the rewiring substrate with the lower flipchip module. This results in a lower-cost, flexible structure, with a matching capability for forming a stack including an electronic module using flipchip technology and an electronic module using bonding technology.

Other features which are considered as characteristic for the invention are set forth in the appended claims.

Although the invention is illustrated and described herein as embodied in an electronic component with semiconductor chips in a stack, and a method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 5 to 11 are schematic cross sectional views taken through intermediate products obtained while producing the first embodiment of the electronic component;

FIG. 5 is a schematic cross sectional view taken through a rewiring substrate;

FIG. 6 is a schematic cross sectional view taken through a rewiring substrate and a first electronic module fitted to the rewiring substrate;

FIG. 7 is a schematic cross sectional view taken through a second electronic module with an unprotected bonding channel;

FIG. 8 is a schematic cross sectional view taken through the second electronic module shown in FIG. 7, but with a protected bonding channel;

FIG. 9 is a schematic cross sectional view taken through a stack formed by the first electronic module and the second electronic module on the rewiring substrate shown in FIG. 5;

FIG. 10 is a schematic cross sectional view taken through a stack as shown in FIG. 9, after applying bonding connections;

FIG. 11 is a schematic cross sectional view taken through an electronic component after the stack constructed as shown in FIG. 10 has been packaged in a component package; and FIG. 12 is a schematic cross sectional view taken through an electronic component after applying external contacts to the rewiring substrate for the electronic component.

DESCRIPTION OF THE PREFERRED EMBODIMENTS

Figure 1:
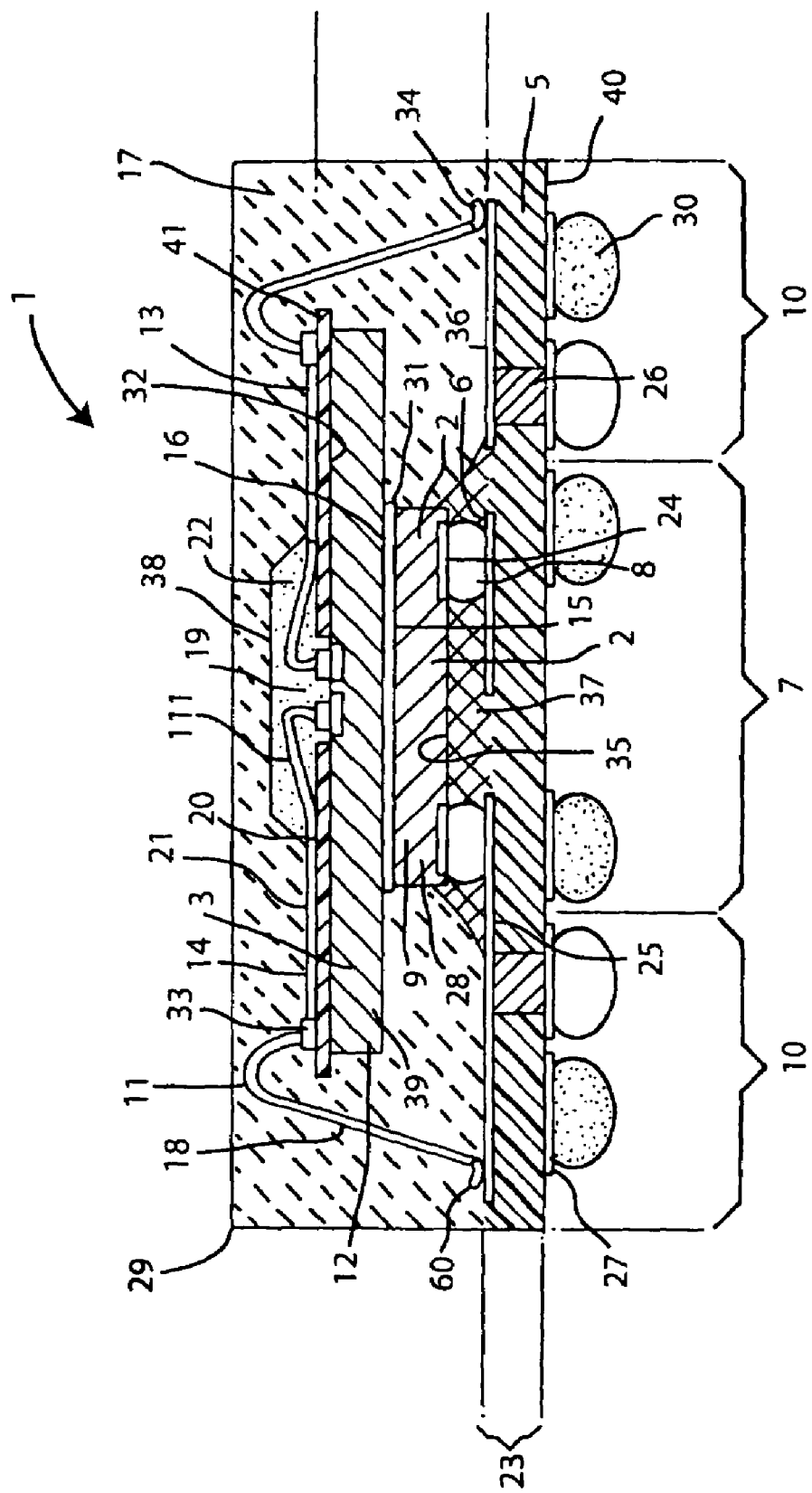
FIG. 1 is a schematic cross sectional view taken through a first embodiment of an electronic component.

Referring now to the figures of the drawing in detail and first, particularly, to FIG. 1 thereof, there is shown a schematic cross sectional view taken through a first embodiment of an electronic component 1. The base of this electronic component 1 forms a rewiring substrate 5 with an upper face 36 and with a lower face 40 that also time forms the lower face of the electronic component 1. External contacts 30 in the form of contact balls are arranged on the lower face 40 and are soldered to external contact surfaces 27 on the rewiring substrate 5. These external contact surfaces 27 on the rewiring substrate 5 are connected via through-contacts 26 and via rewiring substrate lines 25 for the rewiring substrate 5 to connecting pads 6 and 60 on the upper face 36 of the rewiring substrate 5. In this first embodiment of the invention, the rewiring substrate 5 has a printed circuit board 23 serving as the mount material.

Connecting pads 6 for connection to flipchip contacts are arranged in a central area 7 on the upper face 36 of the rewiring substrate 5. Connecting pads 60 for bonding connections are arranged in the edge areas 10 on the upper face 36 of the rewiring substrate 5. At least one logic chip 28, which serves as a first lower electronic module 9, has contact areas 24 that are fitted to the connecting pads 6 in the central area 7, via flipchip connections 8. An adhesive bonding layer 31 is arranged on the passive rear face 15 of this first electronic module 9 and is used for arranging a second upper electronic module 12 on the first lower electronic module 9.

The second electronic module 12 is a memory chip 39 including an active upper face 32 having a central bonding channel 19 with central bonding connections 111. These central bonding connections 111 for the bonding channel 19 are connected via bonding fingers 20 in the rewiring structure 13 to external contact surfaces 14 on the upper electronic module 12. The rewiring structure 13 has an intermediate substrate 41, on whose edge areas the external contact surfaces 14 are arranged. The external contact surfaces 14 are connected via bonding heads 33 from bonding wires 18 to the connecting pads 60 in the edge area 10 of the rewiring substrate 5, forming a bonding clip 34.

A component package 29 surrounds this stack 4 that is formed from at least one lower logic chip 28 and one upper memory chip 39, as well as the bonding connections 18 between the upper memory chip 39 and the rewiring substrate 5. An underfilling material 37, which is in the form of highly filled plastic with a filling level of between 80 and 95% by weight, fills an intermediate space between the active upper face 35 of the logic chip 28 and the upper face 36 of the rewiring substrate 5, and embeds the contact areas 24 of the logic chip 28. The high filling level ensures that the thermal expansion behavior of the underfilling material 37 is largely matched to the thermal expansion behavior of the semiconductor material of the logic chip 28. A protective sheath 22 covers the bonding channel 19, and protects the central bonding connection 111 for the memory chip 39. A material boundary 38 is formed between the protective sheath 22 and the surrounding plastic packaging compound 17 of the component package 29.

This electronic component 1 thus has a stack 4 including a semiconductor chip 2 using flipchip technology and a virtually completely packaged electronic module 12. The functionality of this electronic module 12 will have been tested in extreme temperatures between −50 and 150° C. before it is installed in the electronic component 1. This functionality test can be carried out either by connecting the external contact surfaces 14 of the upper electronic module 12 to an appropriate test connector, or by external contacts being temporarily fitted to the external contact surfaces 14. These external contacts are removed after the test and before installation in the electronic component 1.

In one exemplary embodiment, which is not shown here, the underfilling material 37 is omitted, and the gap between the active upper face 35 and the upper face 36 is filled with the plastic packaging compound 17.

Figure 2:
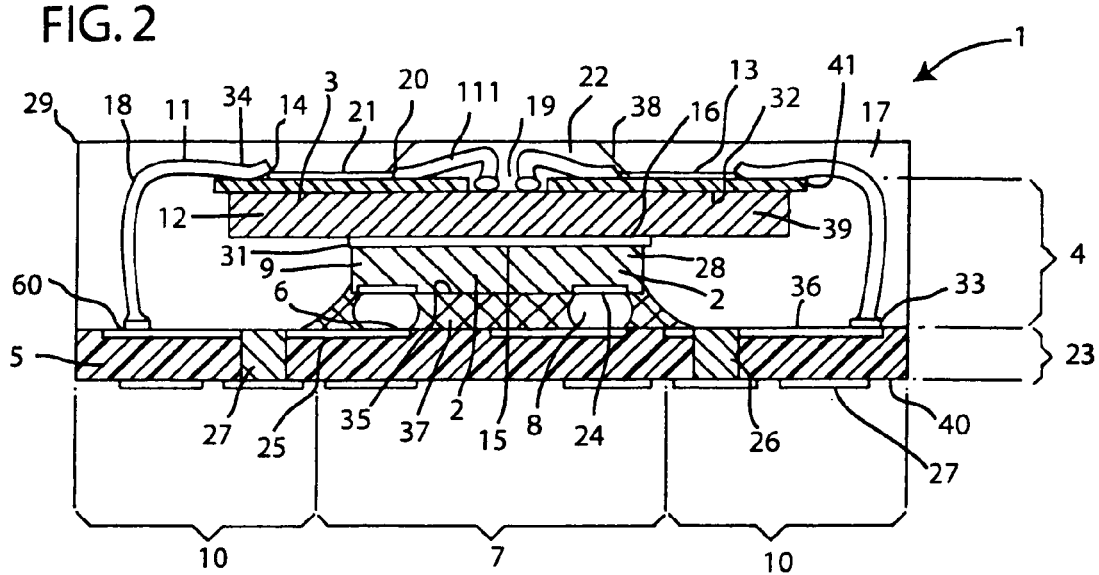
FIG. 2 is a schematic cross sectional view taken through a second embodiment of an electronic component.

FIG. 2 is a schematic cross sectional view taken through a second embodiment of the electronic component 1. Components with the same functions as those in FIG. 1 are identified by the same reference symbols, and will not be explained once again.

One difference between the electronic component 1 shown in FIG. 1 and the second embodiment of the electronic component 1 shown in FIG. 2 is that the bonding wires 18 for the bonding connections 11 are configured with bonding heads 33 on the connecting pads 60 in the edge areas 10 of the rewiring substrate 5. The bonding heads 33 have a component height. The relatively flat bonding clip 34 for a bonding connection 11 such as this is arranged on the external contacts 14 of the upper electronic module 12. This makes it possible to limit the component height of the electronic component 1 by the protective sheath 22 for the bonding channel 19. The electronic component 1 is thus not as high as the electronic component 1 shown in FIG. 1. The material boundary 38 between the plastic packaging compound 17 and the plastic of the protective sheath 22 for the bonding channel 19 is thus restricted to the edge faces of the protective sheath 22.

Figure 3:
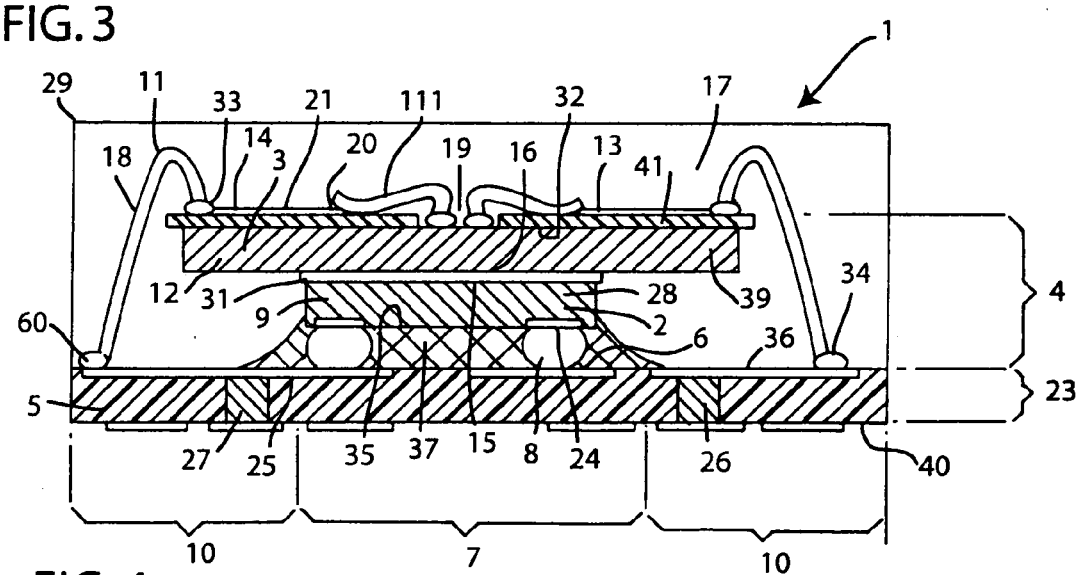
FIG. 3 is a schematic cross sectional view taken through a third embodiment of an electronic component.

FIG. 3 is a schematic cross sectional view taken through a third embodiment of an electronic component 1. Components with the same functions as those in the previous figures are identified by the same reference symbols, and will not be explained again.

The configuration of the stack formed by the electronic modules 9 and 12 in the third embodiment of the invention is the same as in the first embodiment of the invention as shown in FIG. 1. However, in this case, the bonding channel 19 for the upper electronic module 12 is covered by the plastic packaging compound 17, so that no material boundary 38 as shown in FIG. 1 is formed. During assembly of this electronic component 1, the method step of embedding the central bonding connections 111 for the bonding channel 19 in a protective sheath 22 is avoided. Nevertheless, the upper electronic module 12 can be tested for functionality before being installed in an electronic component 1 such as this, and has the external contact surfaces 14 required for the functional test.

Figure 4:
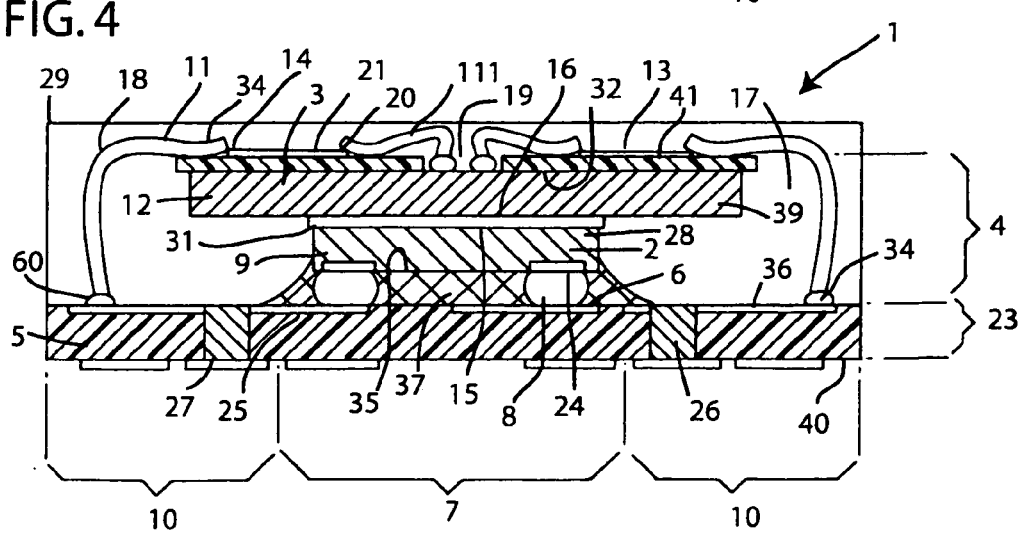
FIG. 4 is a schematic cross sectional view taken through a fourth embodiment of an electronic component.

FIG. 4 is a schematic cross sectional view through a fourth exemplary embodiment of an electronic component 1. Components with the same functions as those in the previous figures are identified by the same reference symbols, and will not be explained again.

The internal configuration of the electronic component 1 in the fourth embodiment of the invention corresponds to the configuration of the electronic component 1 shown in FIG. 2. However, the protective sheath 22 for the bonding channel 19 for the upper electronic module 12 has been omitted in order to save costs. The electronic component 1 is thus produced at low cost, with a minimal component height.

FIGS. 5 to 12 are schematic cross sectional views taken through intermediate products during the production of the first embodiment of an electronic component 1. Components with the same functions as those in the previous figures are identified by the same reference symbols in FIGS. 5 to 12, and will not be explained again.

Figure 5:
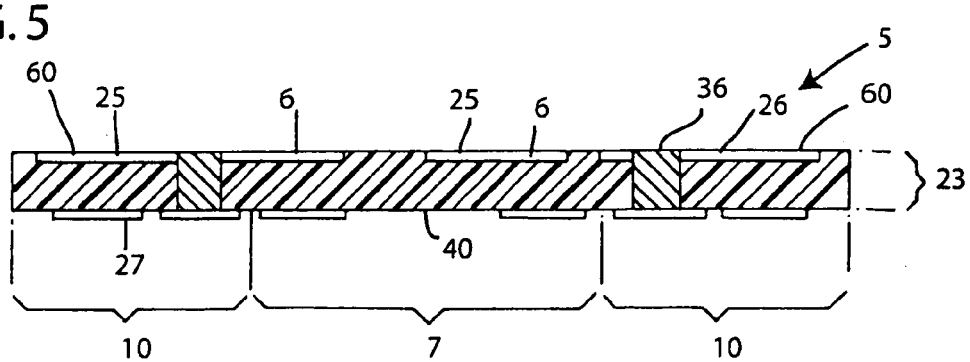

FIG. 5 is a schematic cross sectional view taken through a rewiring substrate 5. This rewiring substrate 5 is produced from a printed circuit board 23 which is metallized on both sides and is structured on both sides. The metal structure on the upper face 36 of the printed circuit board 23 is connected to the metal structure on the lower face 40 of the printed circuit board 23 via through-contacts 26. The lower face 40 of the printed circuit board 23 has external contact surfaces 27, which are arranged in three rings on the lower face 40 of the printed circuit board 23. Rewiring substrate lines 25 are arranged on the upper face 36 of the printed circuit board 23, and are electrically connected to the through-contacts 26. In addition, the rewiring substrate lines 25 connect the through-contacts 26, and hence the external contact surfaces 27, to connecting pads 6 for flipchip connections 8 in a central area 7 of the printed circuit board 23, and/or to connecting pads 60 for the bonding connections 18 in edge areas 10 of the printed circuit board 23.

Figure 6:
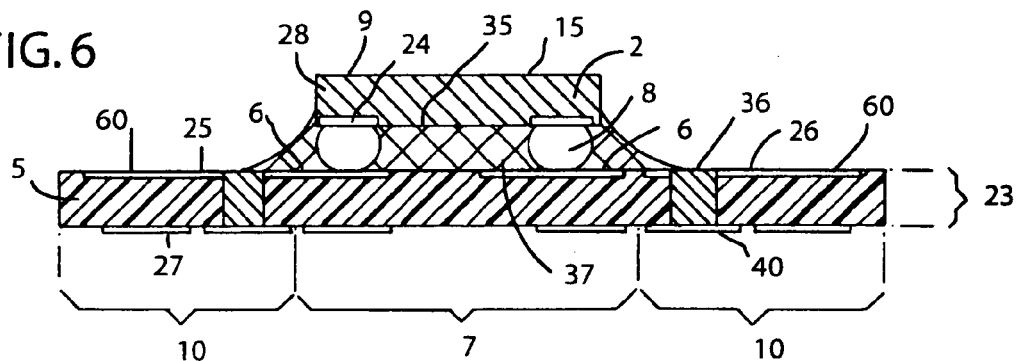

FIG. 6 is a schematic cross sectional view taken through a rewiring substrate 5 with a first electronic module 9 fitted to it. This electronic module 9 is connected via flipchip connections 8 to the connecting pads 6 in the central area 7 of the rewiring substrate 5. The intermediate space between the active upper face 35 of the first lower electronic module 9 and the upper face 36 of the rewiring substrate 5 is filled with an underfilling material 37.

Figure 7:
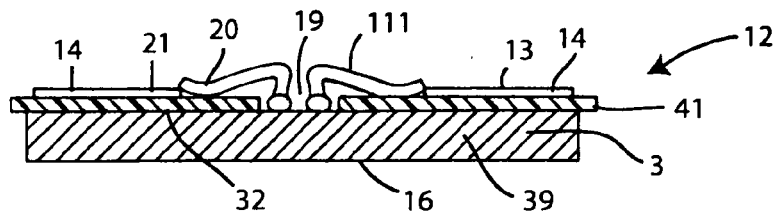

FIG. 7 is a schematic cross sectional view taken through an electronic module 12 with an unprotected bonding channel 19. In addition to a semiconductor chip 3, which in this case is a memory chip 39, this second electronic module 12 has a rewiring structure 13 with an intermediate substrate 41. Furthermore, the second electronic module 12 has a bonding channel 19 with central bonding connections 111, which are connected via the rewiring structure 13 to external contact surfaces 14 on the electronic module 12.

An electronic module 12 which has been prepared in this way is subjected to extreme temperatures between −50 and 150° C. before being installed in an electronic component, during which its functionality is tested. This functional test is also carried out without the central bonding connections 111 in the bonding channel 19 having been protected in advance by a protective sheath.

Figure 8:
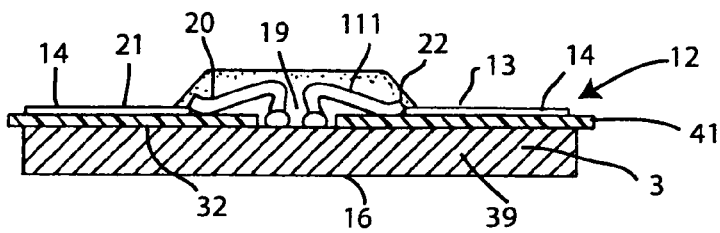

FIG. 8 is a schematic cross sectional view taken through through the second electronic module 12 shown in FIG. 7, but with a protected bonding channel 19. Because of the protected bonding channel 19, handling the second electronic module 12 is easier and safer than handling an electronic module 12 with an unprotected bonding channel 19, as is shown in FIG. 7. This is because the sensitive central bonding connections 111 are embedded in a protective sheath 22, and are protected against mechanical damage during handling.

Figure 9:
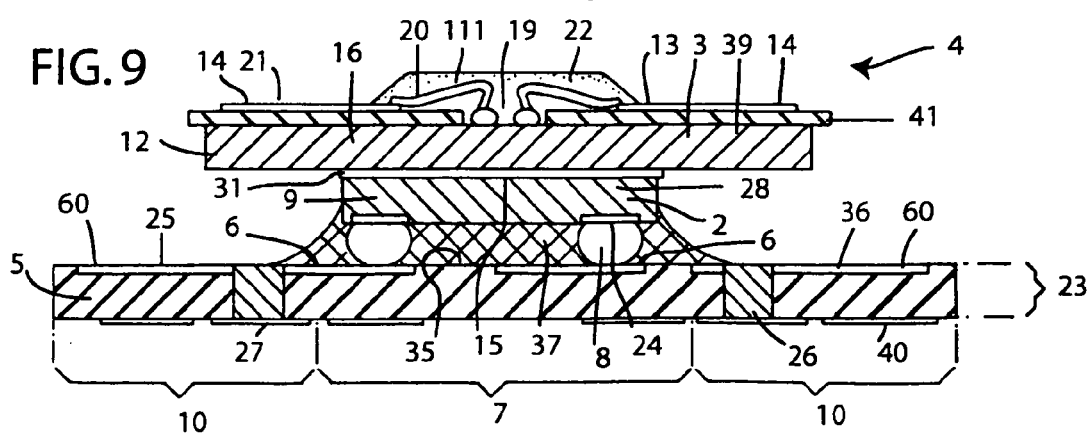

FIG. 9 is a schematic cross sectional view taken through a stack 4 including a first electronic module 9 and a second electronic module 12 on the rewiring substrate 5 as shown in FIG. 5. For this purpose, the second electronic module 12, which has been completely functionally tested, is constructed as shown in FIG. 7 or in FIG. 8, and an adhesive layer 31 adhesively bonds the passive rear face 16 of the second electronic module 12 to the passive rear face 15 of the electronic module 9.

FIG. 10 is a schematic cross sectional view taken through a stack 4 constructed as shown in FIG. 9 after applying the bonding connections 11. These bonding connections 11 are fitted to the external contact surfaces 14 of the rewiring structure 13 of the upper electronic module 12. For this purpose, a bonding head 33 is first of all bonded onto the external contact surfaces 14, and the bonding wire 18 is routed downwards to the connecting pads 60 on the rewiring substrate 5. The bonding wires 18 are then connected to the connecting pads 60, forming a bonding clip 34.

FIG. 11 is a schematic cross sectional view taken through an electronic component 1 after the stack 4 constructed as shown in FIG. 10 has been packaged in a component package 29. In this case, the lower face 40 of the rewiring substrate 5 at the same time forms the lower face of the electronic component 1. In addition, a material boundary 38 is formed between the material of the protective sheath 22 for the bonding channel 19 and the plastic packaging compound 17.

FIG. 12 is a schematic cross sectional view taken through an electronic component 1 after external contacts 30 have been fitted to the rewiring substrate 5. These external contacts 30 are in this case in the form of contact balls, and are arranged in three rings. This is done by soldering contact balls, which can be soldered, to the external contact surfaces 27 on the lower face 40 of the rewiring structure 5.

We claim:

1. A method for producing an electronic component, which comprises:
   providing a rewiring substrate with a central area having connecting pads for forming flipchip connections, and providing the rewiring substrate with edge areas having connecting pads for bonding connections;
   providing a first lower electronic module formed as a semiconductor chip;
   using flipchip technology to apply the lower electronic module to the central area of the rewiring substrate;

providing at least one second upper electronic module including a semiconductor chip and a rewiring structure with external contact surfaces and an intermediate substrate, the rewiring structure being disposed on an active surface of the semiconductor chip; applying a passive rear face of the upper electronic module on a passive rear face of the lower electronic module;

producing bonding connections between the external contact surfaces of the upper electronic module and the connecting pads in the edge areas of the rewiring substrate;

covering a portion of the rewiring structure and a portion of the intermediate substrate with a protective sheath; and packaging the upper electronic module and the lower electronic module and applying a plastic packaging compound to the rewiring substrate.

2. The method according to claim 1, which further comprises: before performing the step of applying the passive rear face of the upper electronic module on the passive rear face of the lower electronic module, testing the upper electronic module in an extreme temperature condition from −50° C. to 150° C.

3. The method according to claim 1, which further comprises:
using at least one logic chip as the lower electronic module; and
using at least one memory chip having the external contact surfaces as the upper electronic module.

4. The method according to claim 1, wherein the step of applying the passive rear face of the upper electronic module on the passive rear face of the lower electronic module includes adhesively bonding the upper electronic module to the passive rear face of the lower electronic module.

5. The method according to claim 1, which further comprises: using wire bonds to perform the step of producing bonding connections between the external contact surfaces of the upper electronic module and the connecting pads in the edge areas of the rewiring substrate.

6. The method according to claim 1, which further comprises: performing the step of producing bonding connections between the external contact surfaces of the upper electronic module and the connecting pads in the edge areas of the rewiring substrate by first bonding wires to the connecting pads in the edge areas of the rewiring substrate and then bonding the wires to the external contact surfaces of the upper electronic module.

7. The method according to claim 1, which further comprises:
incorporating a central bonding channel in the rewiring structure of the upper electronic module; and
using bonding fingers and rewiring substrate lines to electrically conductively connect bonding connections of the central bonding channel to the external contact surfaces of the upper electronic module.

8. The method according to claim 7, which further comprises: covering the central bonding channel and embedding the bonding connections of the central bonding channel with a protective sheath of plastic.

9. The method according to claim 1, wherein the step of providing the rewiring substrate includes: structuring a first metal plating on a printed circuit board to produce a central area with connecting pads for flipchip connections, edge areas with connecting pads for bonding connections, and rewiring substrate lines connected to through-contacts electrically connected to external contact surfaces on a structured second metal plating on the printed circuit board.

10. The method according to claim 1, wherein the step of packaging the upper electronic module and the lower electronic module includes using a transfer molding method to apply a filled epoxy resin to the rewiring substrate.

11. The method according to claim 1, wherein the step of packaging the upper electronic module and the lower electronic module includes using a dispensing method to apply a plastic packaging compound to the rewiring substrate.

12. The method according to claim 1, which further comprises: applying external contacts to external contact surfaces of the rewiring substrate.

13. An electronic component, comprising:
a rewiring substrate having a central area with connecting pads for forming flipchip connections, said rewiring substrate having edge areas with connecting pads;
at least one first lower electronic module formed by a semiconductor chip, said lower electronic module having contact areas electrically connected using flipchip technology to said connecting pads in said central area of said rewiring substrate, said lower electronic module having a passive rear face;
at least one second upper electronic module including a semiconductor chip with an active surface and a rewiring structure with an intermediate substrate and external contact surfaces, said rewiring structure being disposed on said active surface of said semiconductor chip, said upper electronic module having a passive rear face resting against said passive rear face of said lower electronic module;
a plurality of bonding connections between said external contact surfaces of said upper electronic module and said connecting pads in said edge areas of said rewiring substrate;
a component package surrounding said upper electronic module and said lower electronic module; and
a protective sheath covering a portion of said rewiring structure and a portion of said intermediate substrate.

14. The electronic component according to claim 13, wherein:
said lower electronic module is a logic chip; and
said semiconductor chip of said upper electronic module is a memory chip.

15. The electronic component according to claim 13, wherein:
said rewiring substrate includes a printed circuit board having an upper face with structured metal layers, a lower face with structured metal layers, and through-contacts electrically connecting said structured metal layers on said upper face and said structured metal layers on said lower face;
said lower face of said printed circuit board has external contact surfaces with external contacts;
said upper face of said printed circuit board has said central area with said connecting pads for forming flipchip connections;
said upper face of said printed circuit board has said edge areas with said connecting pads in said edge areas of said rewiring substrate; and
said upper face of said printed circuit board has rewiring substrate lines between said connecting pads for forming flipchip connections and said through-contacts.

16. The electronic component according to claim 13, further comprising an adhesive layer configured between said passive rear face of said upper electronic module and said passive rear face of said lower electronic module.

17. The electronic component according to claim 13, wherein:
- said upper electronic module has an active upper face configured with a central bonding channel that has bonding connections;
- said rewiring structure is configured on said active upper face of said upper electronic module; and
- said rewiring structure connects said bonding connections of said bonding channel of said upper electronic module to said external contact surfaces of said upper electronic module.

18. The electronic component according to claim 13, wherein:
- said connecting pads of said rewiring substrate have surfaces;
- normals to said surfaces of said connecting pads of said rewiring substrate point in a first direction;
- said external contact surfaces of said rewiring structure have surfaces; and
- normals to said surfaces of said external contact surfaces of said rewiring structure point in the first direction.

19. The electronic component according to claim 13, wherein said plurality of bonding connections include a bonding wire forming a bonding clip running from one of said connecting pads on said rewiring substrate to a corresponding one of said external contact surfaces on said upper electronic module.

* * * * *